(12) United States Patent
Nakajima

(10) Patent No.: US 10,886,295 B2
(45) Date of Patent: Jan. 5, 2021

(54) SEMICONDUCTOR STORAGE DEVICE

(71) Applicant: TOSHIBA MEMORY CORPORATION, Tokyo (JP)

(72) Inventor: Yasuhito Nakajima, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/560,606

(22) Filed: Sep. 4, 2019

(65) Prior Publication Data

US 2020/0303405 A1 Sep. 24, 2020

(30) Foreign Application Priority Data

Mar. 18, 2019 (JP) .................................. 2019-049665

(51) Int. Cl.
*H01L 27/11582* (2017.01)
*H01L 23/48* (2006.01)
*H01L 27/1157* (2017.01)

(52) U.S. Cl.
CPC ...... *H01L 27/11582* (2013.01); *H01L 23/481* (2013.01); *H01L 27/1157* (2013.01)

(58) Field of Classification Search
CPC ........... H01L 27/11582; H01L 27/1157; H01L 23/481
See application file for complete search history.

(56) References Cited

U.S. PATENT DOCUMENTS

| 5,559,724 | A | * | 9/1996 | Morrison | ............. | G02B 5/1842 |
| | | | | | | 359/569 |
| 5,707,885 | A | * | 1/1998 | Lim | ................. | H01L 29/78642 |
| | | | | | | 438/155 |
| 7,847,342 | B2 | * | 12/2010 | Fukuzumi | ............. | H01L 27/115 |
| | | | | | | 257/324 |
| 8,008,710 | B2 | * | 8/2011 | Fukuzumi | ............. | G11C 5/025 |
| | | | | | | 257/326 |
| 8,013,383 | B2 | * | 9/2011 | Kidoh | ............... | H01L 27/11575 |
| | | | | | | 257/324 |
| 8,148,769 | B2 | * | 4/2012 | Kito | ................. | H01L 27/11578 |
| | | | | | | 257/321 |
| 8,247,863 | B2 | * | 8/2012 | Fukuzumi | ........... | H01L 29/7926 |
| | | | | | | 257/324 |

(Continued)

FOREIGN PATENT DOCUMENTS

JP 2009-135324 A 6/2009
TW 201814872 A 4/2018

*Primary Examiner* — John P. Dulka
(74) *Attorney, Agent, or Firm* — Foley & Lardner LLP

(57) ABSTRACT

According to one embodiment, a semiconductor storage device includes a stacked body, a first columnar body, and a second columnar body. In the stacked body, a plurality of conductive layers and a plurality of insulating layers are alternately stacked along a first direction. The first columnar body extends through the stacked body. The second columnar body extends through the stacked body, and is aligned with the first columnar body along the first direction. The second columnar body includes a second channel film. The first columnar body includes a first channel film, a core surrounded by the first channel film, and a conductive layer. The conductive layer is in contact with the second channel film of the second columnar body and the first channel film of the first columnar body.

9 Claims, 14 Drawing Sheets

(56) References Cited

U.S. PATENT DOCUMENTS

| | | | |
|---|---|---|---|
| 8,581,329 B2* | 11/2013 | Ishiduki | H01L 21/425 |
| | | | 257/324 |
| 8,669,608 B2* | 3/2014 | Sato | H01L 29/7926 |
| | | | 257/324 |
| 8,741,761 B2* | 6/2014 | Lee | H01L 27/11582 |
| | | | 438/595 |
| 8,957,471 B2* | 2/2015 | Fukuzumi | H01L 29/7926 |
| | | | 257/324 |
| 10,665,607 B1* | 5/2020 | Sugiura | H01L 21/76829 |
| 10,734,406 B2* | 8/2020 | Yamasaki | G11C 16/0483 |
| 10,748,894 B2* | 8/2020 | Chowdhury | H01L 27/10897 |
| 2009/0146206 A1 | 6/2009 | Fukuzumi | |
| 2010/0109065 A1 | 5/2010 | Oh et al. | |
| 2012/0241978 A1* | 9/2012 | Mino | H01L 27/11519 |
| | | | 257/775 |
| 2013/0270714 A1* | 10/2013 | Lee | H01L 21/76816 |
| | | | 257/774 |
| 2016/0233224 A1* | 8/2016 | Rhie | H01L 27/11582 |
| 2019/0214405 A1 | 7/2019 | Shirai et al. | |
| 2019/0252404 A1* | 8/2019 | Kaminaga | H01L 21/76802 |
| 2019/0312051 A1* | 10/2019 | Park | H01L 27/11565 |
| 2020/0027893 A1* | 1/2020 | Yang | H01L 21/76831 |
| 2020/0075622 A1* | 3/2020 | Fujii | H01L 21/823487 |
| 2020/0203495 A1* | 6/2020 | Shin | H01L 29/42376 |
| 2020/0235090 A1* | 7/2020 | Chowdhury | G11C 5/02 |

\* cited by examiner

SEMICONDUCTOR STORAGE DEVICE

CROSS-REFERENCE TO RELATED APPLICATION(S)

This application is based upon and claims the benefit of priority from Japanese Patent Application No. 2019-049665, filed Mar. 18, 2019, the entire contents of which are incorporated herein by reference.

FIELD

Embodiments described herein relate generally to a semiconductor storage device.

BACKGROUND

A NAND flash memory in which memory cells are stacked three-dimensionally is known.

Example of related art includes JP-A-2009-135324.

DETAILED DESCRIPTION

Figure 1:
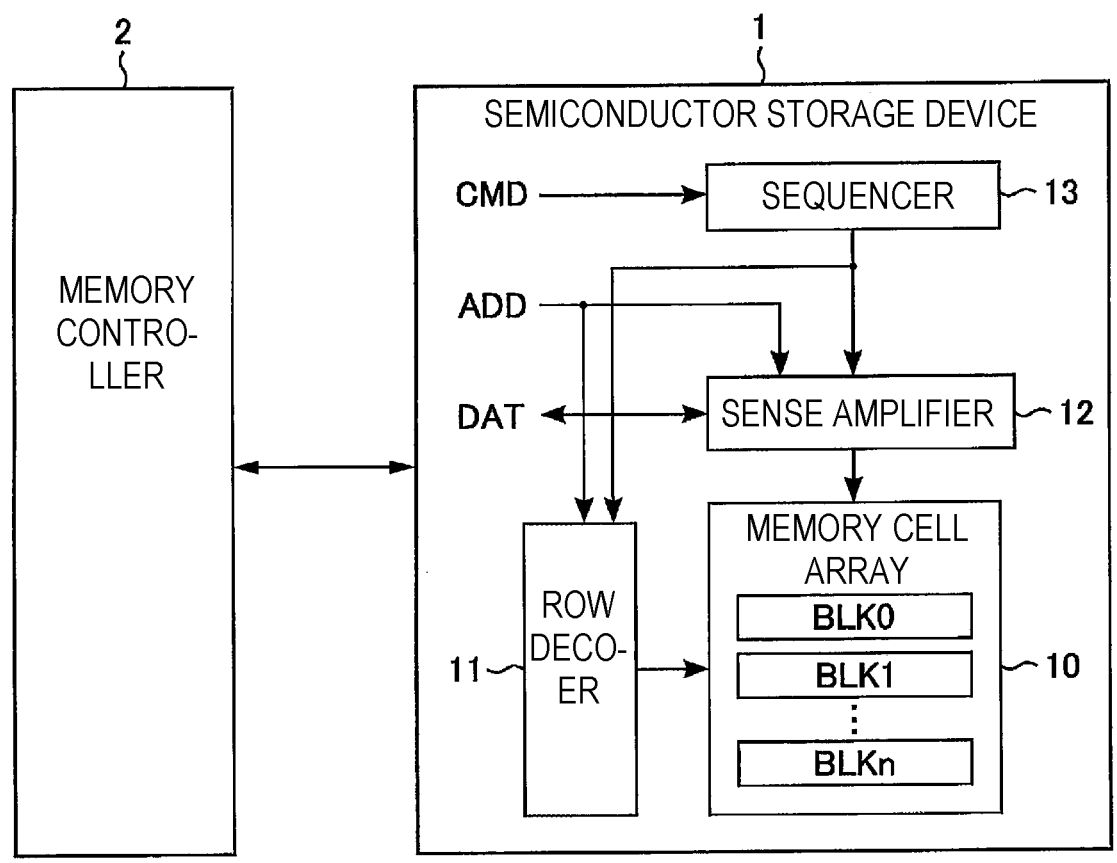
FIG. 1 is a block view illustrating a system configuration of a semiconductor storage device according to a first embodiment.

Embodiments provide a semiconductor storage device capable of reducing power consumption.

In general, according to one embodiment, a semiconductor storage device includes a stacked body, a first columnar body, and a second columnar body. In the stacked body, a plurality of conductive lines and a plurality of insulating layers are alternately stacked along a first direction. The first columnar body extends through the stacked body. The second columnar body extends through the stacked body and is aligned with the first columnar body along the first direction. The second columnar body includes a second channel film. The first columnar body includes a core, a first channel film surrounding the core, and a conductive layer. The conductive layer is in contact with the second channel film of the second columnar body and the first channel film of the first columnar body.

Next, a semiconductor storage device according to an embodiment will be described with reference to drawings. In the following descriptions, configurations having the same or similar functions are denoted by the same reference numerals. Configurations having the same or similar functions may not be repeatedly described. Numerals after letters that constitute reference numerals are referred to by the reference numeral including the same letter, and are used to distinguish between elements having the same configurations. When it is not necessary to distinguish between the elements indicated by the reference numeral that includes the same letter, the elements are referred to by the reference numeral that includes only the same letter.

In the following descriptions, a +X direction, a −X direction, a +Y direction, and a −Y direction are directions parallel to a surface of a semiconductor substrate of a semiconductor storage device of an embodiment. The +X direction is a direction that is directed from one string unit of the semiconductor storage device of the embodiment to another string unit. The −X direction is a direction opposite to the +X direction. When the +X direction and the −X direction are not distinguished, those directions are simply referred to as an "X direction." The +Y direction and the −Y direction are directions that intersects with the X direction. The −Y direction is a direction opposite to the +Y direction. When the +Y direction and the −Y direction are not distinguished, those directions are simply referred to as a "Y direction." A +Z direction and a −Z direction are directions that intersects with the X direction and the Y direction. The +Z direction is a direction that is directed from the semiconductor substrate of the semiconductor storage device of the embodiment to a stacked body (see FIG. 4). The −Z direction is a direction opposite to the +Z direction. When the +Z direction and the −Z direction are not distinguished, those directions are simply referred to as a "Z direction." The "+Z direction" may be referred to as "upper," and the "−Z direction" may be referred to as "lower." The expressions such as "upper" and "lower" are used for convenience, and do not necessarily define the direction of gravity. In the present embodiment, the +Z direction is an example of a "first direction."

"Connection" in the specification includes electrical connection, in addition to physical connection. "Extending in an A direction" in the specification refers to that, for example, a dimension in the A direction is larger than the smallest dimension among the dimensions in the X direction, the Y direction, and the Z direction. The "A direction" is any direction.

First Embodiment

An overall configuration of a semiconductor storage device according to a first embodiment will be described. The semiconductor storage device according to the embodiment is a non-volatile semiconductor storage device, and is, for example, a NAND flash memory.

FIG. 1 is a block view illustrating a system configuration of a semiconductor storage device 1 according to the embodiment. The semiconductor storage device 1 includes a memory cell array 10, a row decoder 11, a sense amplifier 12, and a sequencer 13.

The memory cell array 10 includes a plurality of blocks (BLK0 to BLKn). "n" is an integer of 1 or more. Each block BLK is a group of a plurality of non-volatile memory cell transistors. A plurality of bit lines and a plurality of word lines are provided in the memory cell array 10. Each memory cell transistor is related to one bit line and one word line.

The row decoder 11 selects one block BLK based on address information ADD received from an external memory controller 2. The row decoder 11 controls a writing operation and a reading operation of data for the memory cell array 10 by applying desired voltages to the plurality of word lines.

The sense amplifier 12 applies desired voltages to the plurality of bit lines in accordance with the data DAT received from the memory controller 2. The sense amplifier 12 determines the data stored in the memory cell transistor based on the voltage of the bit line, and transmits the determined data DAT to the memory controller 2.

The sequencer 13 controls the overall operation of the semiconductor storage device 1, based on a command CMD received from the memory controller 2.

The combination of the semiconductor storage device 1 and the memory controller 2 described above constitutes one semiconductor device. Examples of the semiconductor device may include, for example, a memory card such as SD (registered trademark) card or a solid state drive (SSD).

Figure 2:
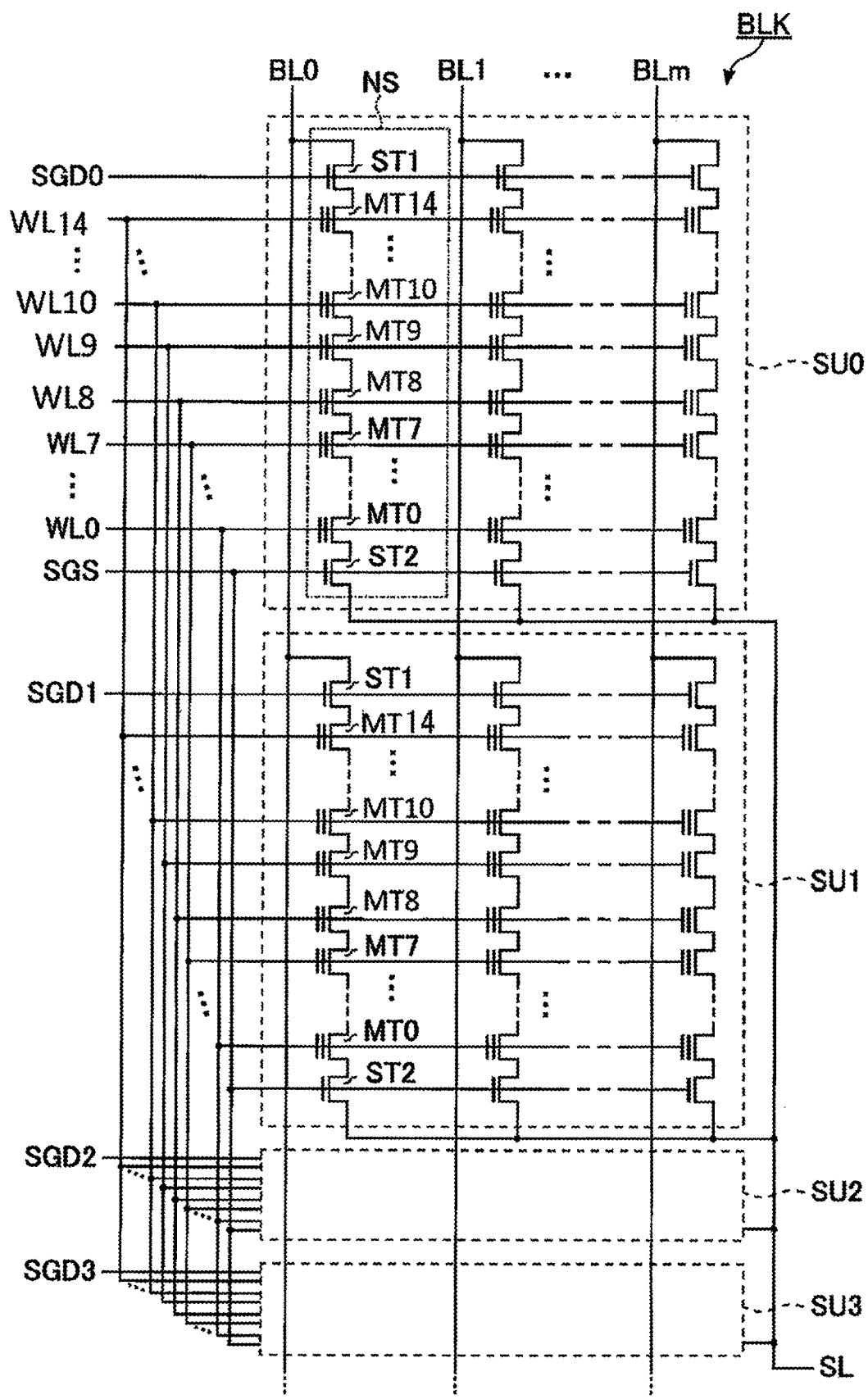
FIG. 2 is a view illustrating an equivalent circuit of a memory cell array according to the first embodiment.

Next, an electrical configuration of the memory cell array 10 will be described. FIG. 2 is a view illustrating an equivalent circuit of the memory cell array 10, and illustrates one block BLK. The block BLK includes a plurality of string units SU. In FIG. 2, the block BLK includes four string units SU0 to SU3.

The string unit SU is a group of a plurality of NAND strings NS. One end of each NAND string NS is connected to one of the plurality of bit lines BL0 to BLm. "m" is an integer of 1 or more. The other end of each NAND string NS is connected to a source line SL. The NAND string NS includes a plurality of memory cell transistors MT, a first selective transistor ST1, and a second selective transistor ST2. In FIG. 2, the NAND string NS includes fifteen memory cell transistors MT0 to MT14.

The plurality of memory cell transistors MT are connected in series with one another. Each memory cell transistor MT includes a control gate and a charge storage film, and stores data in a non-volatile manner. The memory cell transistor MT stores charges in the charge storage film in accordance with the voltage applied to the control gate. The control gate of the memory cell transistor MT is connected to one of the plurality of word lines WL. In FIG. 2, fifteen word lines WL0 to WL14 are illustrated. The memory cell transistor MT is connected to the row decoder 11 via the corresponding word line WL.

The first selective transistor ST1 is connected between the plurality of memory cell transistors MT and the corresponding bit line BL. A drain of the first selective transistor ST1 is connected to the bit line BL. A source of the first selective transistor ST1 is connected to the plurality of memory cell transistors MT. The control gate of the first selective transistor ST1 is connected to a corresponding selective gate line SGD. In FIG. 2, the selective gate line SGD corresponding to the control gate of the first selective transistor ST1 is one of the selective gate lines SGD0 to SGD3. The first selective transistor ST1 is connected to the row decoder 11 via the selective gate line SGD. The first selective transistor ST1 connects the NAND string NS and the bit line BL, when a predetermined voltage is applied to the selective gate line SGD.

The second selective transistor ST2 is connected between the plurality of memory cell transistors MT and the source line SL. A drain of the second selective transistor ST2 is connected to the plurality of memory cell transistors MT. A source of the second selective transistor ST2 is connected to the source line SL. The control gate of the second selective transistor ST2 is connected to a selective gate line SGS. The second selective transistor ST2 is connected to the row decoder 11 via the selective gate line SGS. The second selective transistor ST2 connects the NAND string NS and the source line SL, when a predetermined voltage is applied to the selective gate line SGS.

Figure 3:
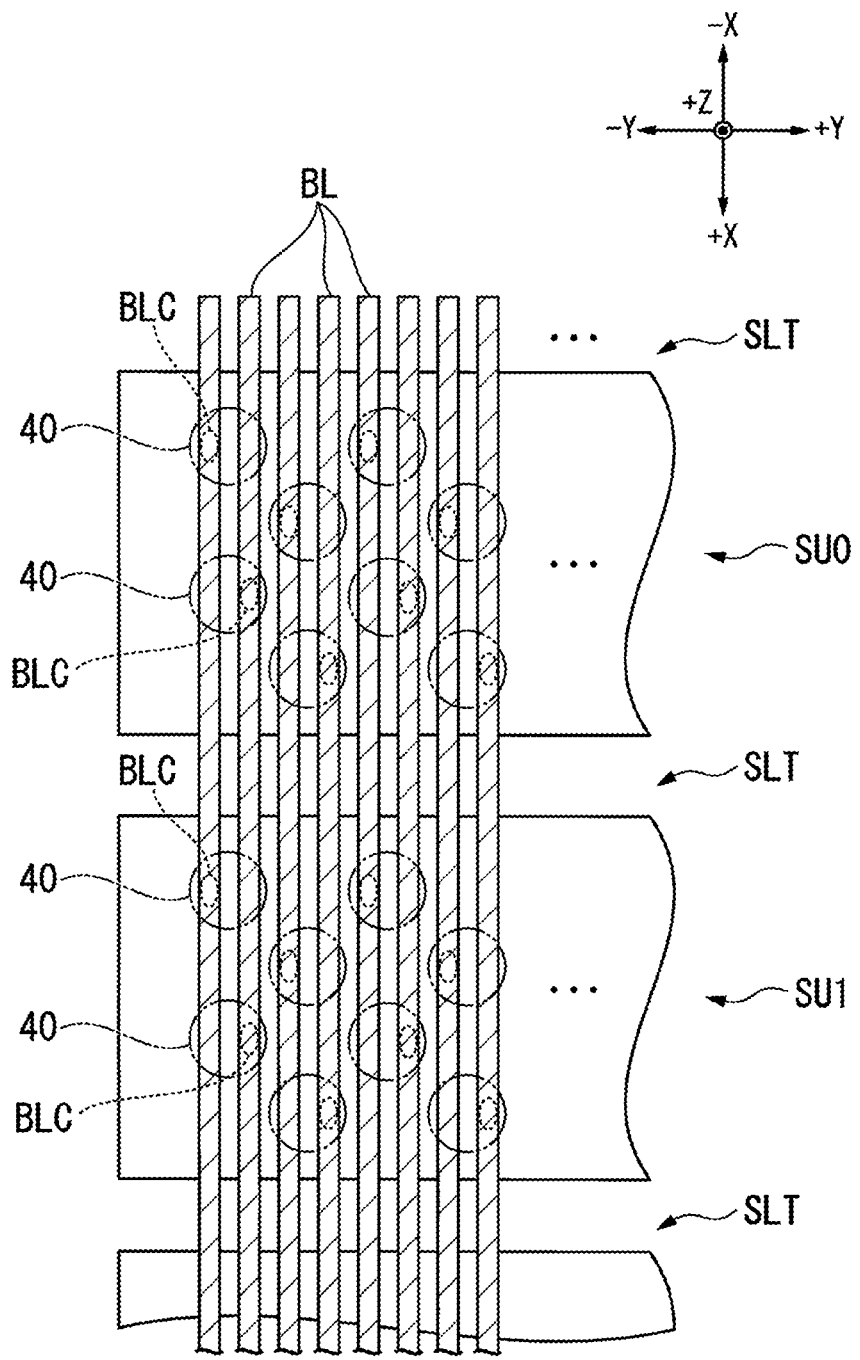
FIG. 3 is a plan view illustrating a part of the memory cell array according to the first embodiment.

Next, a physical configuration of the memory cell array 10 will be described. FIG. 3 is a plan view of a part of the memory cell array 10. For example, the plurality of string units SU are arranged in the X direction. In FIG. 3, two string units SU0 and SU1 are illustrated. Each string unit SU extends in the Y direction. In the X direction, the plurality of string units SU are separated from one another by a slit SLT filled with an insulating material. Each string unit SU includes a plurality of columnar bodies 40 that extend in the Z direction. Each columnar body 40 is connected with one bit line BL via a contact plug BLC. The bit line BL extends in the X direction.

Figure 4:
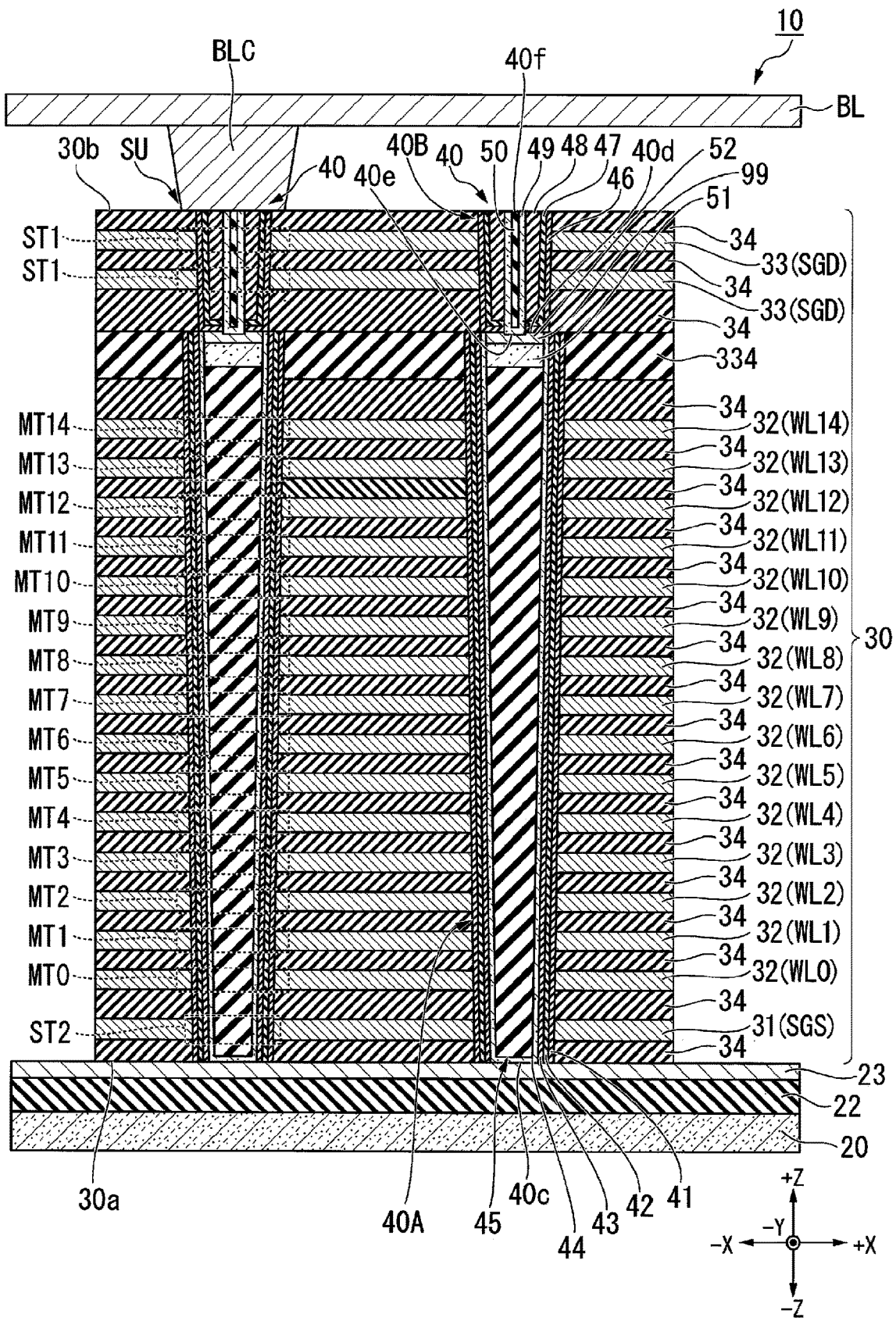
FIG. 4 is a cross-sectional view illustrating a part of the memory cell array according to the first embodiment.

FIG. 4 is a cross-sectional view of a part of the memory cell array 10. The memory cell array 10 includes a semiconductor substrate 20, a stacked body 30, the plurality of columnar bodies 40, the plurality of contact plugs BLC, and the plurality of bit lines BL. In FIG. 4, one contact plug BLC and one bit line BL are illustrated.

The semiconductor substrate 20 extends in the X direction and the Y direction. An insulating layer 22 is provided on the semiconductor substrate 20. A drive circuit including, for example, a complementary MOS (CMOS) is provided inside the insulating layer 22. A conductive layer 23 is provided on the insulating layer 22. The conductive layer 23 is formed in a plate shape substantially parallel to the X direction and the Y direction, and functions as the source line SL.

The stacked body 30 is provided on the conductive layer 23. The stacked body 30 includes one conductive layer 31, a plurality of conductive layers 32, a plurality of conductive layers 33, and a plurality of insulating layers 34. In FIG. 4, two conductive layers 33 are illustrated. The conductive layers 31, 32, and 33 and the insulating layer 34 are stacked in the Z direction.

The conductive layers 31, 32, and 33 are made of, for example, tungsten. The conductive layer 31 is the lowermost conductive layer in the stacked body 30. The conductive layer 31 functions as the selective gate line SGS. The conductive layers 33 are the uppermost conductive layer and the conductive layer on a side lower by one therefrom in the stacked body 30. The conductive layers 33 function as the selective gate line SGD. The plurality of conductive layers 32 are positioned above the conductive layer 31, and also below the conductive layer 33. The plurality of layers 32 function as the word lines WL0 to WL14. The respective conductive layers 31, 32, and 33 are formed in a plate shape along the X direction and the Y direction. A block insulating film may be provided at an interface between the respective conductive layers 31, 32, and 33 and the insulating layer 34, and at an interface between the respective conductive layers 31, 32, and 33 and the columnar body 40.

The insulating layer 34 is made of, for example, silicon oxide. The insulating layer 34 is provided between the conductive layer 31 and the conductive layer 32, between the plurality of conductive layers 32, between the conductive layer 32 and the conductive layer 33, and between the plurality of conductive layers 33. The insulating layer 34 insulates the respective conductive layers 31, 32, and 33 from one another. The respective insulating layer 34 is formed in a plate shape along the X direction and the Y direction.

The columnar body 40 functions as, for example, one NAND string NS. The columnar body 40 is provided in the stacked body 30 along the Z direction. The columnar body is provided from the upper surface 30b to the lower surface 30a of the stacked body 30 in the Z direction. The columnar body 40 includes a first columnar body 40A and a second columnar body 40B.

The first columnar body 40A is provided in the stacked body 30. The lower end 40c of the first columnar body 40A is in contact with the conductive layer 23. A portion where the second columnar body 40B and the conductive layer 33 intersect each other functions as the first selective transistor ST1. Portions where the first columnar body 40A and the plurality of conductive layers 32 intersect function as the memory cell transistor MT, respectively. In FIG. 4, fifteen memory cell transistors MT0 to MT14 are illustrated. A portion where the first columnar body 40A and the conductive layer 31 intersect each other functions as the second selective transistor ST2.

A width of the first columnar body 40A is gradually tapered in the X direction and the Y direction as it progresses from the upper end 40d to the lower end 40c. The first columnar body 40A has, for example, a circular shape or an elliptical shape when viewed in the Z direction.

The first columnar body 40A includes at least a channel film 44, a core 45, and a conductive layer 99. The core 45 is provided closer to the center of the first columnar body 40A than the channel film 44 in the X direction and the Y direction. In the embodiment, any of the X direction and the Y direction can be an example of the "second direction" that intersects with the first direction. The conductive layer 99 includes at least one of a metal layer or a silicide layer. In the first embodiment, the conductive layer 99 includes a metal layer 52, and is provided closer to the center of the first columnar body 40A than the channel film 44 in the X direction and the Y direction. The metal layer 52 is provided on an end of the first columnar body 40A in contact with the second columnar body 40B. The metal layer 52 is positioned between the core 45 and the second columnar body 40B in the Z direction.

The first columnar body 40A further includes a barrier film 41, a charge storage film 42, a tunnel film 43, and a cap layer 51. The barrier film 41 is provided on an inner wall of a hole that penetrates the conductive layer 31, the conductive layers 32, and the insulating layer 34 below the uppermost conductive layer 32 in the Z direction. The barrier film 41 is a film capable of preventing a phenomenon in which charges move from the conductive layer 32 to the charge storage film 42 or the core 45.

The first columnar body 40A includes the charge storage film 42 provided on the side opposite to the core 45 and the conductive layer 99 with respect to the channel film 44. The charge storage film 42 is provided on an inner wall of the barrier film 41. The charge storage film 42 is a film capable of storing charges in accordance with the voltage applied to the selective gate line SGD. The tunnel film 43 is provided on an inner wall of the charge storage film 42. The tunnel film 43 is a film capable of causing the cell current from the channel film 44 to flow to the charge storage film 42 by the tunnel effect. The channel film 44 is provided on an inner wall of the tunnel film 43. The channel film 44 functions as a transistor channel that constitutes the NAND string NS.

The core 45 is provided closer to the center of the second columnar body 40B than a channel film 49 in the X direction and the Y direction. The core 45 becomes a support that positions the barrier film 41, the charge storage film 42, the tunnel film 43, and the channel film 44 in the Z direction. The core 45, the cap layer 51, and the metal layer 52 are provided in a region surrounded by the tunnel film 43 in the X direction and the Y direction. The cap layer 51 is provided on the core 45. The cap layer 51 is a layer capable of preventing the movement or diffusion of a metal element from the metal layer 52. The metal layer 52 is provided on the cap layer 51. The metal layer 52 forms a path that allows the cell current from the channel film 49 provided above to flow to the channel film 44. The first columnar body 40A includes, in the cross-section that intersects in the Z direction, the core 45, one of the cap layer 51 and the metal layer 52, the channel film 44, the tunnel film 43, the charge storage film 42, and the barrier film 41 in the order from the inside in the radial direction centering on the center of the core 45 in the radial direction.

The barrier film 41 is made of, for example, an insulator such as silicon oxide, aluminum oxide, and zirconium oxide. The charge storage film 42 is made of, for example, an insulator such as silicon nitride. The tunnel film 43 is made of, for example, an insulator such as silicon oxide. The channel film 44 is made of, for example, a semiconductor of, such as polysilicon partially doped with an impurity. The impurity contained in the channel film 44 is, for example, any one selected from a group consisting of carbon, phosphorus, boron, and germanium. The core 45 is made of, for example, an insulator such as silicon oxide. The cap layer 51 is made of, for example, a semiconductor of, such as amorphous silicon. The metal layer 52 is made of, for example, a metal such as tungsten.

When viewed along the Z direction, the entire core 45 is covered by the cap layer 51, and the entire cap layer 51 is covered by the metal layer 52. The cap layer 51 is in contact with the channel film 44 in any direction that includes the X direction and the Y direction, and intersects in the Z direction. The metal layer 52 is in contact with the channel film 44 in any direction that intersects in the Z direction. The thickness of the metal layer 52 in the Z direction is thinner than the thickness of the cap layer 51 in the Z direction.

The second columnar body 40B is provided in the stacked body 30, and is aligned with the first columnar body 40A in the Z direction. In the embodiment, the second columnar body 40B is positioned above the first columnar body 40A. The lower end 40e of the second columnar body 40B is in contact with the first columnar body 40A. The upper end 40f of the second columnar body 40B is connected to the bit line BL, via the contact plug BLC. The second columnar body 40B can electrically connect the contact plug BLC and the first columnar body 40A. A width of the second columnar body 40B is, for example, gradually tapered along the Z direction (e.g., the direction along which the second columnar body 40B extends from the upper end 40f to the lower end 40e). The second columnar body 40B has, for example, a circular shape or an elliptical shape when viewed in the Z direction.

The second columnar body 40B includes the channel film 49, and a core 50 that is provided closer to the center of the second columnar body 40B than the channel film 49 in the X direction and the Y direction. The metal layer 52 is in contact with the channel film 49 while being in contact with the channel film 44.

The second columnar body 40B includes a barrier film 46, a charge storage film 47, a tunnel film 48, the channel film 49, and the core 50. The barrier film 46 is provided on an inner wall of a hole that penetrates the conductive layer 33, and the insulating layer 34 above the uppermost conductive layer 32 in the Z direction. The charge storage film 47 is provided on an inner wall of the barrier film 46. The tunnel film 48 is provided on an inner wall of the charge storage film 47. The channel film 49 is provided on an inner wall of the tunnel film 48. The core 50 is provided in a region surrounded by the tunnel film 48 in the X direction and the Y direction. That is, the second columnar body 40B includes the core 50, the channel film 49, the tunnel film 48, the charge storage film 47, and the barrier film 46 in the order from the inside.

The barrier film 46 is a film capable of preventing a phenomenon in which charges move from the conductive layer 33 to the charge storage film 47 or the core 50. The charge storage film 47 is a film capable of storing charges in accordance with the voltage applied to the selective gate line SGD. The tunnel film 48 is a film capable of causing the cell current from the channel film 44 to flow to the charge storage film 47 by the tunnel effect. The channel film 49 functions as the transistor channel that constitutes the NAND string NS, together with the channel film 44. The core 50 becomes a support that positions the barrier film 46, the charge storage film 47, the tunnel film 48, and the channel film 49 in the Z direction.

The barrier film 46 is made of, for example, any one of silicon oxide, aluminum oxide, and zirconium oxide. The charge storage film 47 is made of, for example, silicon nitride. The tunnel film 48 is made of, for example, silicon oxide. The channel film 49 is made of, for example, polysilicon partially doped with an impurity. In order to adjust the threshold current of the selective gate line SGD, an impurity such as boron is appropriately injected to the channel film 49 in a region near to the metal layer 52 in the Z direction. The core 50 is made of, for example, silicon oxide.

Figure 5:
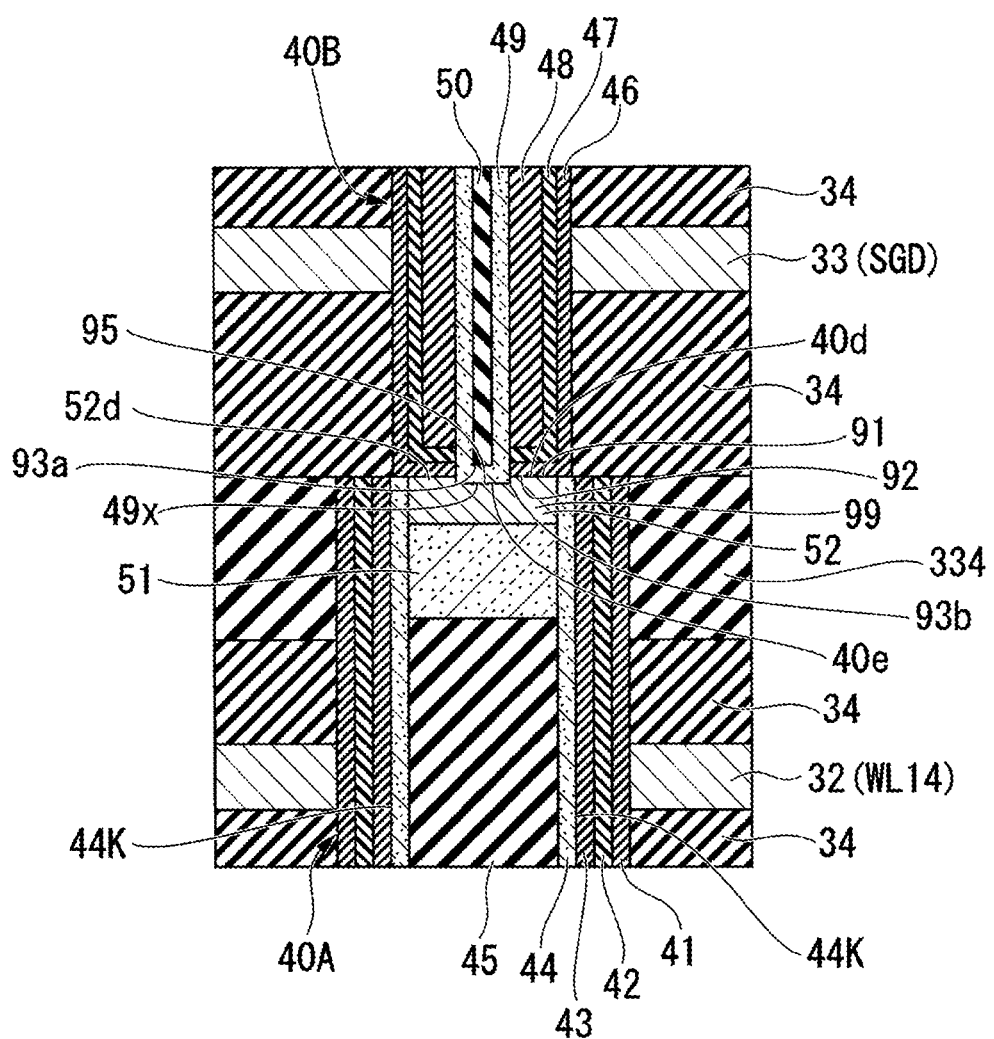
FIG. 5 is an enlarged cross-sectional view of a boundary between a first columnar body and a second columnar body of the memory cell array according to the first embodiment.
Figure 5:
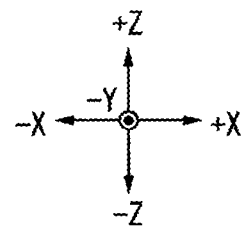

FIG. 5 is an enlarged cross-sectional view of a boundary between the first columnar body 40A and the second columnar body 40B. The channel film 49 is provided on the inner wall of the hole that reaches below the upper end 40f and enters the metal layer 52. That is, the channel film 49 is in contact with the metal layer 52.

The metal layer 52 includes a cross section 52d (a first surface) in contact with the second columnar body 40B. The cross section 52d includes a recess 95 that is recessed toward the core 45. The lower end of the channel film 49 is positioned in the recess 95. As a result, the contact area between the channel film 49 and the metal layer 52 is increased, and thus, the contact resistance between the channel film 49 and the channel film 44 is decreased as compared to the case where the lower end of the channel film 49 is not positioned in the recess 95.

At the lower end of the second columnar body 40B, the charge storage film 47 wraps around below the tunnel film 48. Further, at the lower end of the second columnar body 40B, the barrier film 46 wraps around below the charge storage film 47.

When viewed from the Z direction, the width of the lower end 49x of the channel film 49 in contact with the metal layer 52 is smaller than the width of the upper cross section 52d including the portion of the metal layer 52 in contact with the channel film 49. In the cross section of the first columnar body 40A including the cross section 52d, the metal layer 52, the channel film 44, the tunnel film 43, the charge storage film 42, and the barrier film 41 are arranged in the order from the inside.

The first columnar body 40A includes a first connecting end 91 in contact with the second columnar body 40B. The second columnar body 40B includes a second connecting end 92 in contact with the first columnar body 40A. The channel film 49 includes a first channel end 93a which is one end in the X direction and the Y direction, and a second channel end 93b which is the other end in the X direction and the Y direction. A length of the metal layer 52 at the first connecting end 91 in the X direction and the Y direction is longer than a length between the first channel end 93a and the second channel end 93b at the second connecting end 92 in the X direction and the Y direction.

When viewed along the Z direction, the charge storage film 47 and the tunnel film 48 are overlapped with the metal layer 52, and surrounded by the metal layer 52.

The contact plug BLC is a connecting member columnar of a columnar shape, an inverted truncated cone shape or the like made of a conductive material.

Next, an example of a method for manufacturing the memory cell array 10 will be described. The method for manufacturing the memory cell array 10 includes, for example, a pre-process, a first stacking process, a first hole forming process, a second stacking process, an opening forming process, a channel film forming process, a slimming process, a core forming process, a substituting process, a slit processing process, a cap layer forming process, and a metal layer forming process. FIGS. 6 to 13 are cross-sectional views illustrating respective manufacturing processes of the memory cell array 10.

In the pre-process, the insulating layer 22 and the conductive layer 23 are formed on the semiconductor substrate 20. The drive circuit including, for example, a CMOS is formed on the insulating layer 22.

Figure 6:
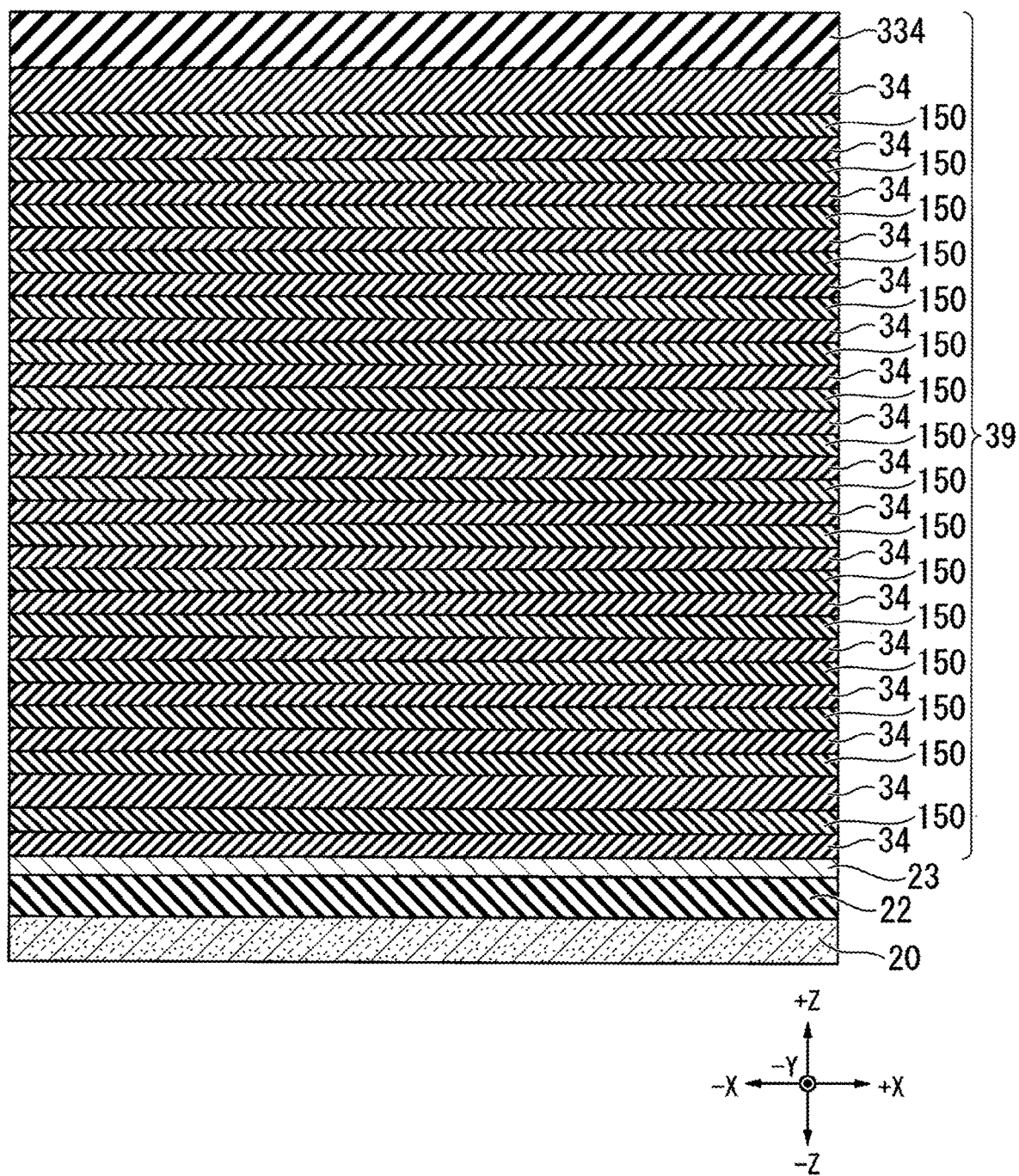
FIG. 6 is a cross-sectional view illustrating a manufacturing process of the memory cell array according to the first embodiment.

FIG. 6 is a cross-sectional view illustrating the first stacking process. In the first stacking process, the insulating layer 34 and a substitution material 150 are alternately stacked on the conductive layer 23. The plurality of insulating layers 34 and the plurality of substitution materials 150 are alternately stacked to form a stacked body 39. The substitution material 150 is, for example, a nitride film such as silicon nitride. An insulating layer 334 is formed on the uppermost insulating layer 34. The insulating layer 334 is, for example, tetraethyl orthosilicate (TEOS).

Figure 7:
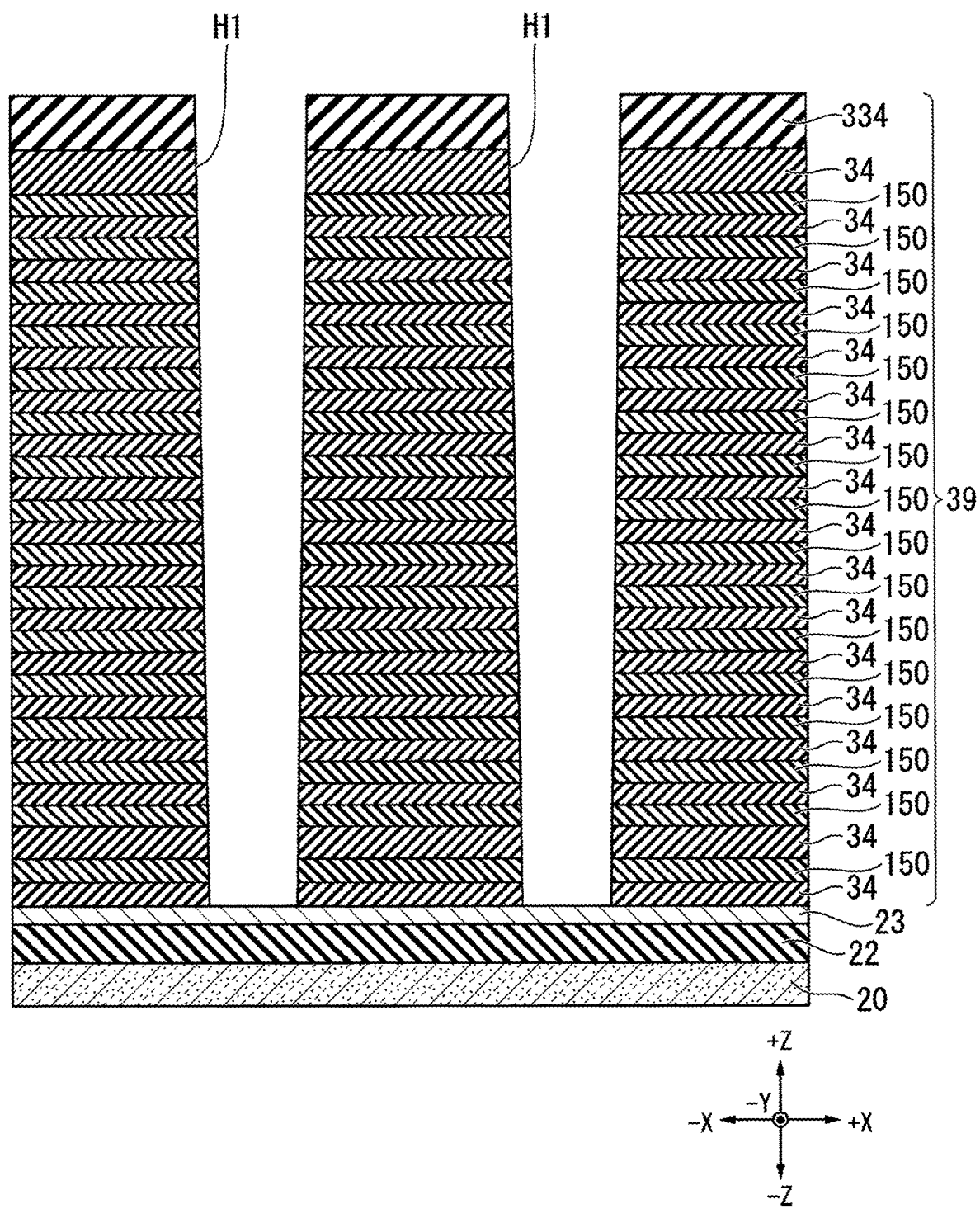
FIG. 7 is a cross-sectional view illustrating a manufacturing process of the memory cell array according to the first embodiment.

FIG. 7 is a cross-sectional view illustrating the first hole forming process. In the first hole forming process, a hole H1 is processed in the stacked body 39. The hole H1 extends from an upper surface to a lower surface of the stacked body 39. The hole H1 is processed by photolithography and anisotropic etching. As anisotropic etching, for example, reactive ion etching (RIE) may be used.

Figure 8:
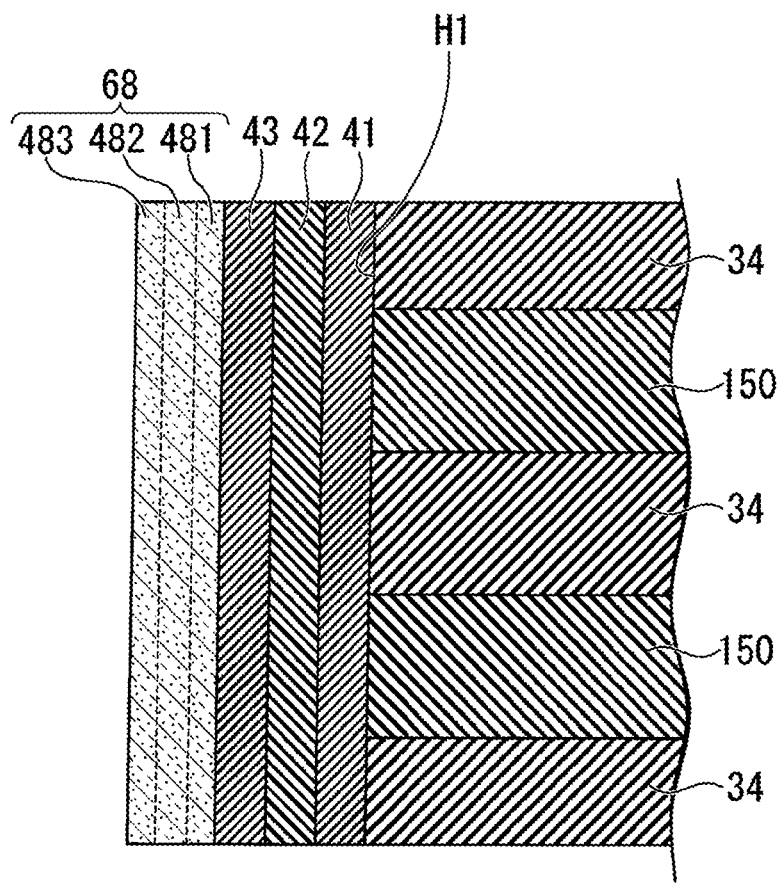
FIG. 8 is a cross-sectional view illustrating a manufacturing process of the memory cell array according to the first embodiment.

FIG. 8 is an enlarged cross-sectional view illustrating the second stacking process and the channel film forming process. In the second stacking process, the barrier film 41, the charge storage film 42, the tunnel film 43, and a cover insulating film (not illustrated) are stacked in this order along an inner wall of the hole H1 and on an upper surface of the insulating layer 334. The barrier film 41, the charge storage film 42, the tunnel film 43, and the cover insulating film respectively have a bottom portion, and are formed in a cylindrical shape.

In the opening forming process, an opening is formed on a bottom portion of the barrier film 41, the charge storage film 42, the tunnel film 43, and the cover insulating film. The opening is formed by, for example, RIE. After forming the opening, the cover insulating film is removed. The cover insulating film is removed by, for example, etching. An upper surface of the conductive layer 23 is exposed in the opening.

In the channel film forming process, a channel film 68 is formed along an inner wall and on an upper surface of the tunnel film 43. Since the opening is formed on the bottom portion of the tunnel film 43, the channel film 68 is connected from the upper surface of the stacked body 39 to the upper surface of the conductive layer 23. The channel film 68 is doped with an impurity during film formation. The impurity is supplied as, for example, a gas, and doped into the channel film 68.

In the channel film forming process, for example, a first layer 481, a second layer 482, and a third layer 483 are formed in the order from the inner surface of the tunnel film 43. When forming the first layer 481 and the third layer 483, an impurity is not supplied to the first layer 481 and the third layer 483. The first layer 481 and the third layer 483 are, for example, non-doped amorphous silicon. When forming the second layer 482, an impurity is supplied to the second layer 482. The second layer 482 is, for example, amorphous silicon doped with carbon.

Next, the first layer 481, the second layer 482, and the third layer 483 are heated. Amorphous silicon is crystallized by heating to become polysilicon. The first layer 481 and the third layer 483 are, for example, non-doped polysilicon. The second layer 482 is, for example, polysilicon doped with carbon. A part of the impurity contained in the second layer 482 is diffused into the first layer 481 and the third layer 483 by heating.

Next, the film formed is thinned by the slimming process. In the slimming process, the surface of the channel film 68 is oxidized, and then, the oxide film is etched. The oxidizing of the surface of the channel film 68 is performed, for example, using hydrogen peroxide. The etching of the oxide film is performed, for example, using trimethyl-2 hydroxyethyl ammonium hydroxide (TMY). In the slimming process, for example, a portion of the channel film 68 is removed up to the second layer 482. The channel film is made thinner after film formation by the slimming process, and becomes the channel film 44.

Figure 9:
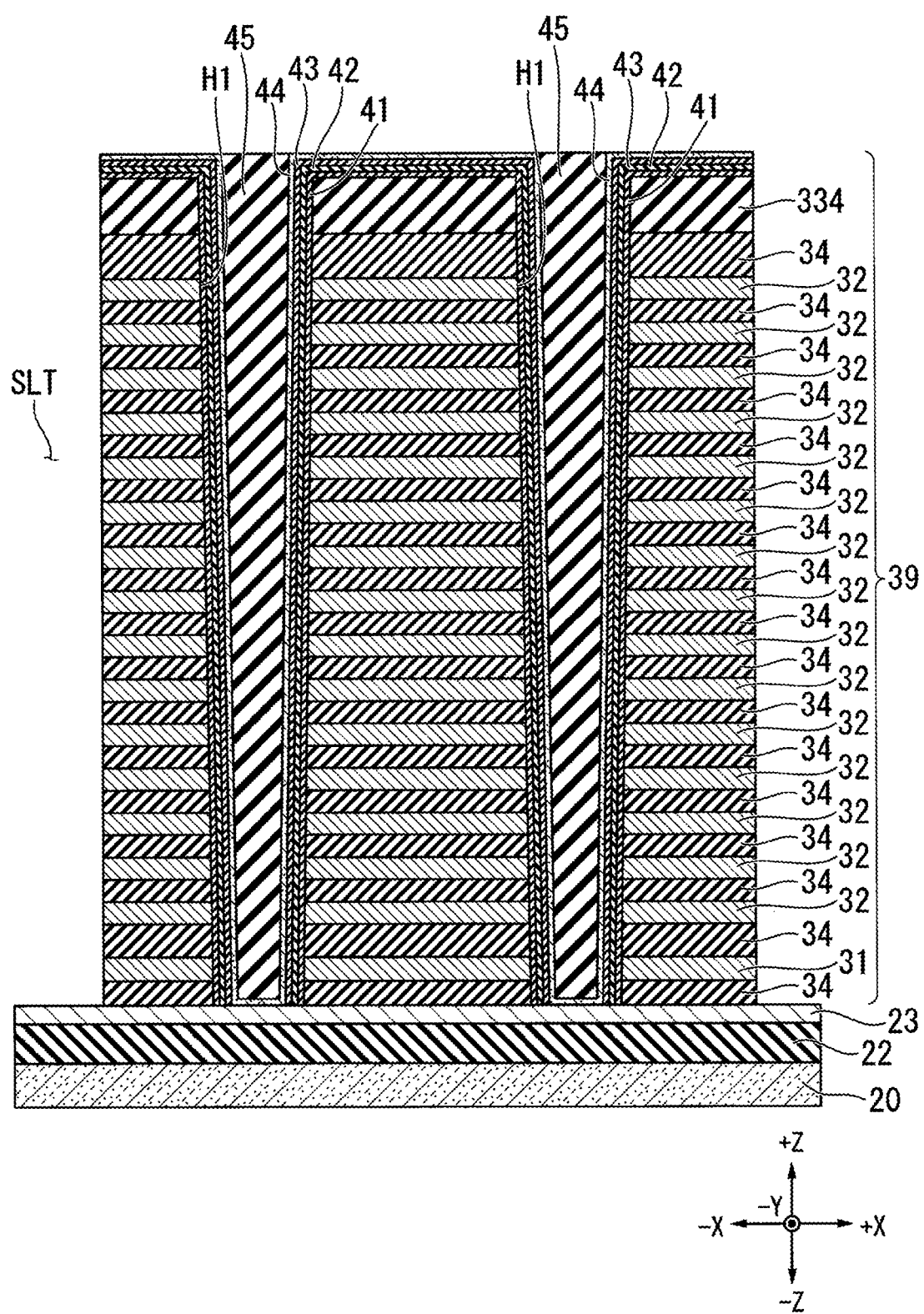
FIG. 9 is a cross-sectional view illustrating a manufacturing process of the memory cell array according to the first embodiment.

FIG. 9 is a cross-sectional view illustrating the core forming process and the substituting process. In the core forming process, the core 45 is formed on the inner surface of the hole H1 in the slimmed channel film 44. The core 45 is filled inside the region surrounded by the channel film in the X direction and the Y direction. The first columnar body 40A is formed by forming the core 45.

Next, the slit SLT is formed by the slit processing process, and the stacked body 39 is divided into a plurality of string units SU. In FIG. 9, one string unit SU among the plurality of string units SU is illustrated. In the substituting process, the substitution material 150 is removed by wet etching through the slit SLT. Next, a conductive material is filled into the space from which the substitution material 150 is removed to form the conductive layers 31 and 32. The stacked body 39 becomes the stacked body 30 by substituting the substitution material 150 with the conductive layers 31 and 32.

Figure 10:
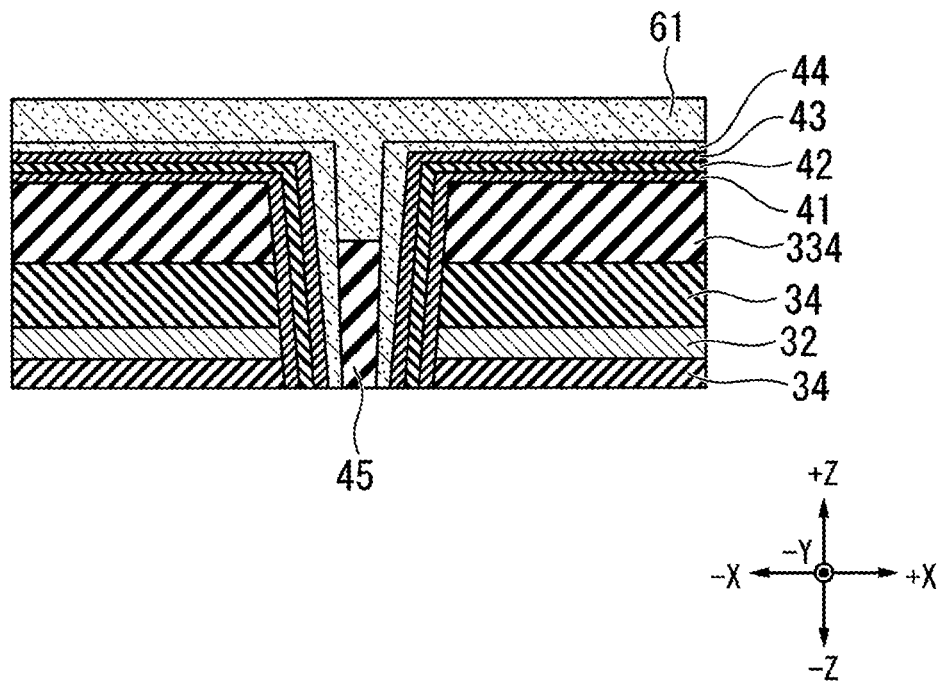
FIG. 10 is an enlarged cross-sectional view illustrating an upper end of the first columnar body in a manufacturing process of the memory cell array according to the first embodiment.
Figure 11:
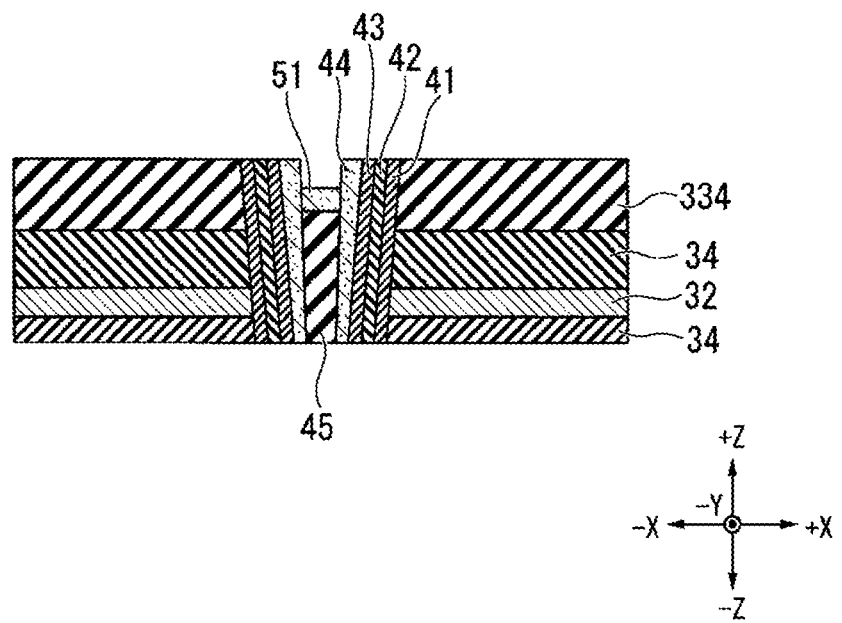
FIG. 11 is an enlarged cross-sectional view illustrating an upper end of the first columnar body in a manufacturing process of the memory cell array according to the first embodiment.

FIGS. 10 and 11 are cross-sectional views illustrating the cap layer forming process. In the cap layer forming process, an upper portion of the core 45 is removed by etching. Thereafter, a recess formed above the core 45 is filled to form a semiconductor layer 61 on the channel film 44. The semiconductor layer 61 is, for example, amorphous silicon.

Next, the insulating layer 334 is exposed by removing the semiconductor layer 61 on the upper surface of the channel film 44, a portion of the channel film 44, a portion of the tunnel film 43, a portion of the charge storage film 42, and a portion of the barrier film 41. An upper portion of the semiconductor layer 61 remained below the upper surface of the insulating layer 334, and also on the core 45 is removed. The semiconductor layer 61 is removed by etching. The cap layer 51 recessed from the upper surface of the insulating layer 334 is formed above the core 45.

Figure 12:
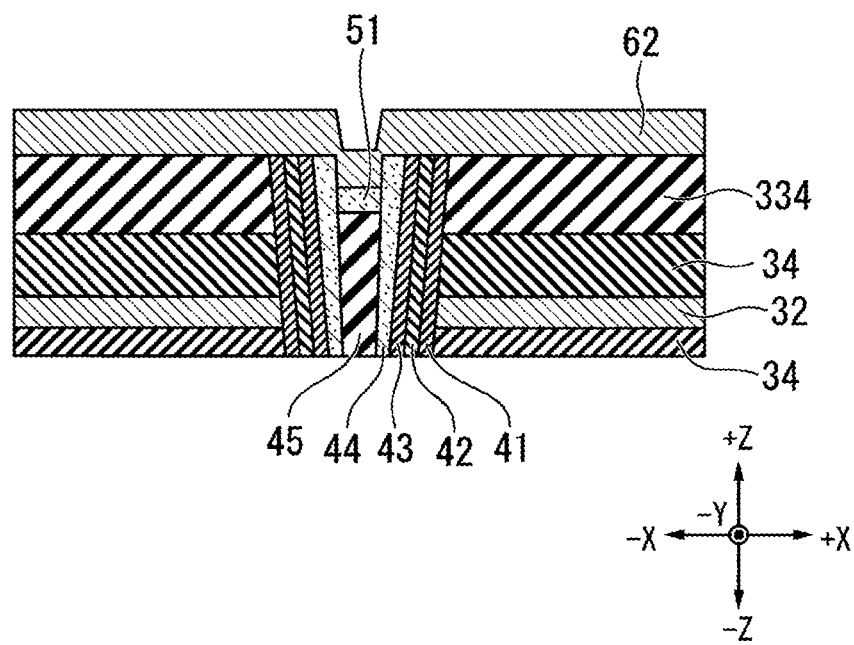
FIG. 12 is an enlarged cross-sectional view illustrating an upper end of the first columnar body in a manufacturing process of the memory cell array according to the first embodiment.
Figure 13:
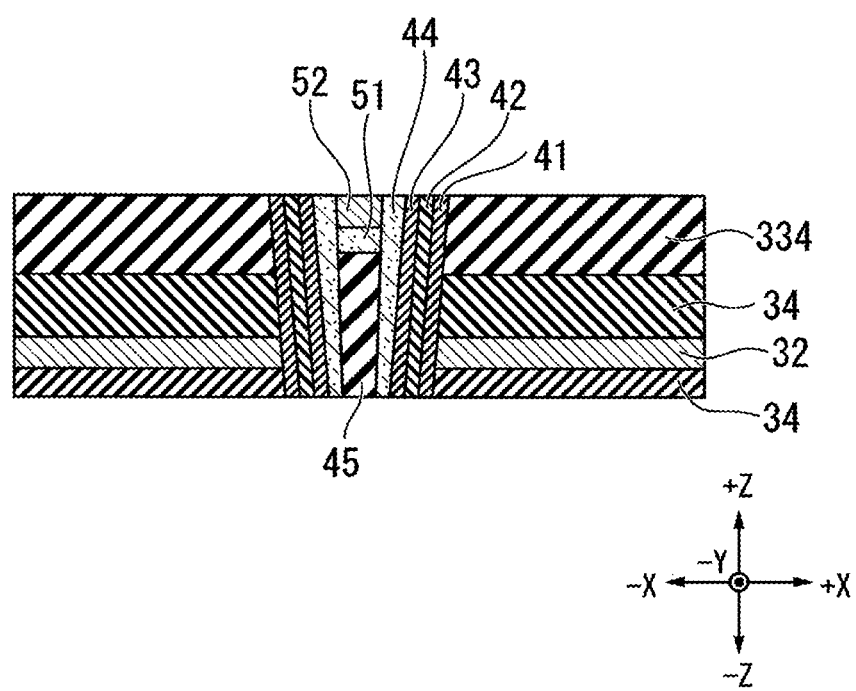
FIG. 13 is an enlarged cross-sectional view illustrating an upper end of the first columnar body in a manufacturing process of the memory cell array according to the first embodiment.

FIGS. 12 and 13 are cross-sectional views illustrating the metal layer forming process. In the metal layer forming process, a metal layer 62 is formed on the upper surface of the insulating layer 334 and the upper surface of the cap layer 51 with a constant thickness. The metal layer 62 is made of, for example, tungsten. An upper surface of the metal layer 62 above the cap layer 51 is higher than the upper surface of the insulating layer 334. Thereafter, an upper portion of the metal layer 62 is removed until the insulating layer 334 is exposed. The metal layer 62 is removed by, for example, chemical mechanical polishing (CMP). The metal layer 52 surrounded by the channel film 44 is formed above the cap layer 51.

Next, in the same manner as in the first stacking process, an insulating layer and a substitution material are alternately stacked on the insulating layer 334, the channel film 44, the tunnel film 43, the charge storage film 42, the barrier film 41, and the metal layer 52 exposed above. In the same manner as in the first hole forming process, a hole is processed in the stacked body of the insulating layer and the substitution material above the metal layer 52. In the X direction and the Y direction, the width of the above hole is made smaller than the width of the upper surface of the metal layer 52, and the metal layer 52 is exposed over the entire bottom portion of the hole.

Next, in the same manner as in the second stacking process, the barrier film 46, the charge storage film 47, and the tunnel film 48 are formed on an inner wall of the hole above the metal layer 52. Thereafter, in the same manner as in the opening forming process, an opening is formed on a bottom portion of the barrier film 46, the charge storage film 47, the tunnel film 48, and the cover insulating film. A bottom surface of the opening is positioned below the upper surface of the metal layer 52 at the end of the third stacking process. That is, a recess is formed on the upper surface of the metal layer 52 at the end of the third stacking process by the formation of the opening.

Next, in the same manner as in the channel film forming process and the slimming process, the channel film 49 is formed on the inner wall of the tunnel film 48 and on the recess of the metal layer 52. Thereafter, in the same manner as in the core forming process, the core 50 is formed on the inner wall of the channel film 49. The core 50 is filled inside the region surrounded by the channel film 49 in the X direction and the Y direction. The second columnar body 40B is formed by forming the core 50.

The stacked body 30 and the columnar body 40 are formed by the above processes. However, the method of manufacturing the semiconductor storage device 1 is not limited to the above example.

Figure 14:
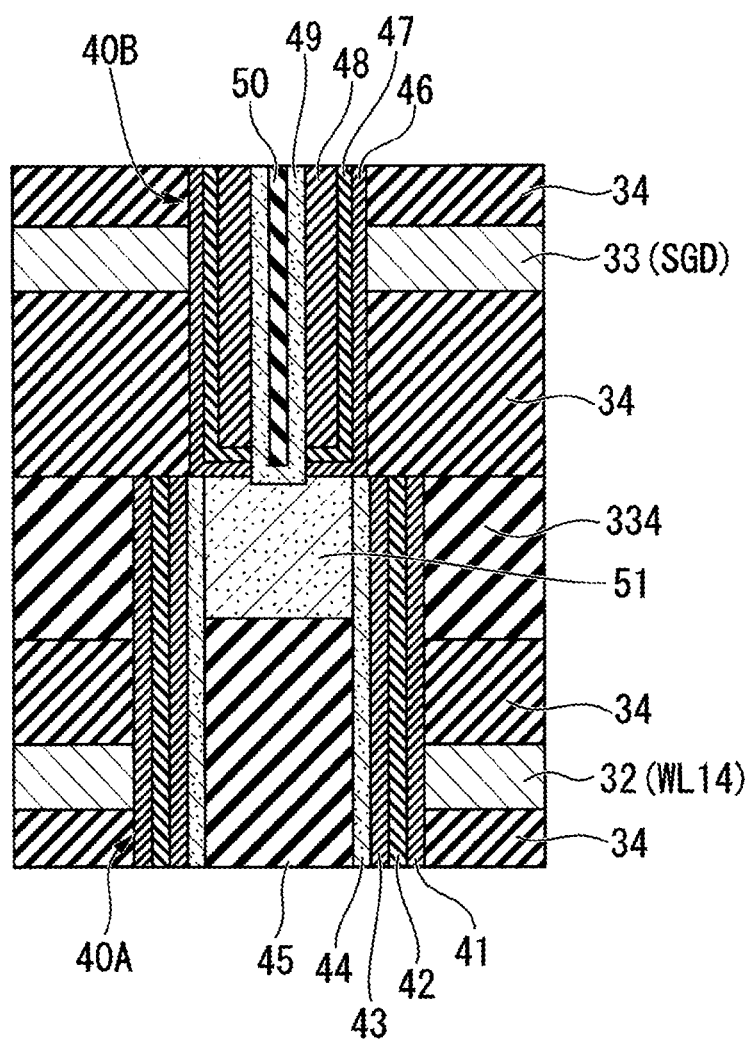
FIG. 14 is an enlarged cross-sectional view of a boundary between a first columnar body and a second columnar body of the memory cell array according to the related art.

According to the semiconductor storage device 1 described above, the power consumption may be reduced by having the metal layer 52. FIG. 14 is an enlarged cross-sectional view of a boundary between the first columnar body 40A and the second columnar body 40B of a memory cell array of a semiconductor storage device in the related art. In a configuration of the related art illustrated in FIG. 14, between the bottom portion of the channel film 49 and the top of the channel film 44, the cap layer 51 having a width larger than those channel films is interposed in the X direction and the Y direction. Therefore, the contact resistance between the channel film 49 and the channel film is high. In the semiconductor storage device 1, the metal layer 52 is interposed between the channel film 49 and the channel film 44. Therefore, the contact resistance between the channel film 49 and the channel film 44 may be reduced. The power consumption of the semiconductor storage device 1 may be reduced by reducing the contact resistance in the memory cell array 10.

According to the semiconductor storage device 1, an upper end of the channel film 44 is in contact with the metal layer 52. Therefore, it is easy to form an inverted layer when the cell current is applied to the channel film 44. The cell current flows smoothly from the channel film 49 to the channel film 44 by formation of the inverted layer.

According to the semiconductor storage device 1, when viewed from the Z direction, a width of a lower end 49x is smaller than the width of the cross section 52d, and thus, the lower end 49x, that is the entire bottom surface of the channel film 49 may be brought into contact with the cross section 52d to reduce the power consumption. It is possible to prevent the occurrence of the interruption of the cell current by the stable connection between the lower end 49x and the cross section 52d.

In the semiconductor storage device 1, the tunnel films 43 and 48 and the charge storage films 42 and 47 are interposed between the channel films 44 and 49 and the channel films 41 and 46. According to the semiconductor storage device 1, when the cell current is supplied to the channel film 49, charges may be stored in the charge storage films 42 and 47 by the tunnel effect.

Second Embodiment

Figure 15:
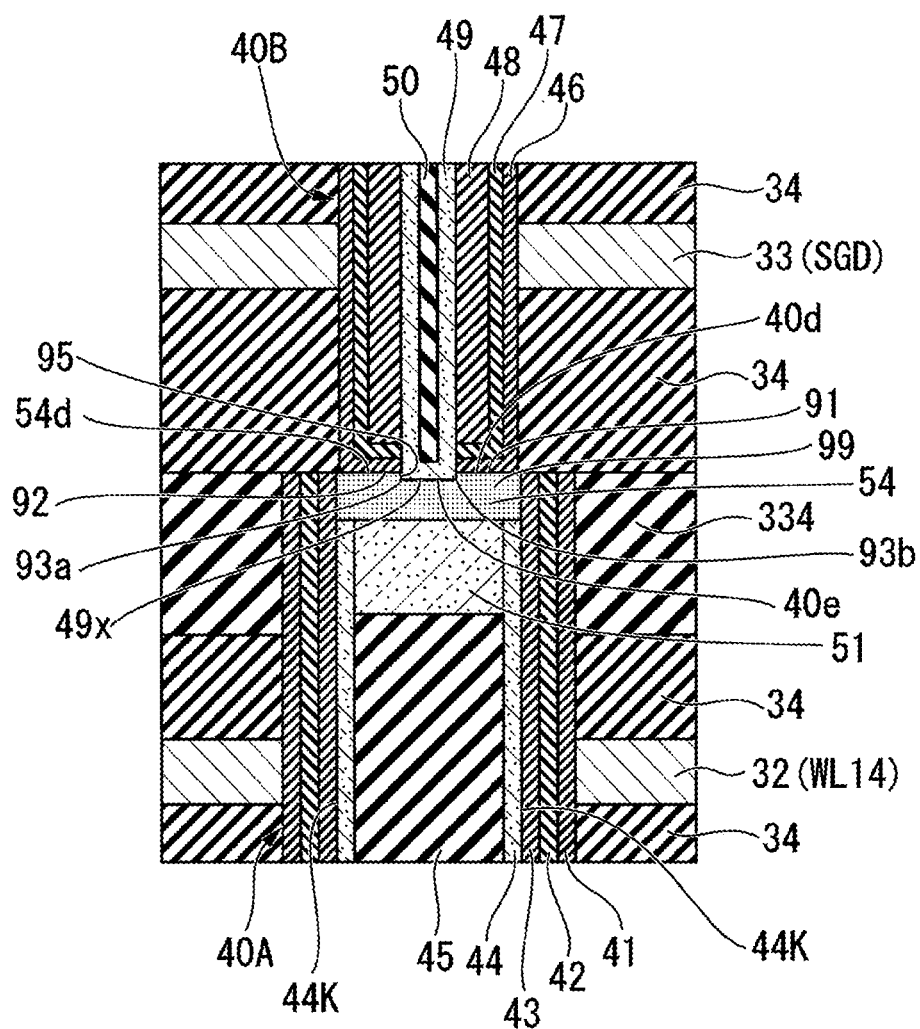
FIG. 15 is an enlarged cross-sectional view of a boundary between a first columnar body and a second columnar body of the memory cell array according to a second embodiment.

FIG. 15 is a cross-sectional view illustrating a part of a region of a memory cell array according to a second embodiment. In the memory cell array according to the second embodiment, the conductive layer 99 includes a silicide layer 54. The silicide layer 54 is provided closer to the center of the first columnar body 40A than the tunnel film 43 in the X direction and the Y direction. The silicide layer 54 is provided on the cap layer 51 and the channel film 44. Similarly to the metal layer 52, the silicide layer 54 forms a path that allows the cell current from the channel film 49 provided above to flow to the channel film 44. Configurations other than the configurations of the memory cell array according to the second embodiment described below is the same as the configurations of the memory cell array 10 according to the first embodiment.

FIG. 15 is an enlarged cross-sectional view of a boundary between the first columnar body 40A and the second columnar body 40B. The silicide layer 54 is provided on the cap layer 51. That is, when viewed along the Z direction, the first columnar body 40A includes the core 45, any one of the cap layer 51 and the silicide layer 54, the channel film 44, the tunnel film 43, the charge storage film 42, and the barrier film 41 in the order from the inside. The silicide layer 54 is made by, for example, silicidation of a transition metal such as titanium. Similarly to the metal layer 52, the silicide layer 54 forms a path that allows the cell current from the channel film 49 provided above to flow to the channel film 44.

When viewed from the Z direction, the width of the lower end 49x of the channel film 49 in contact with the silicide layer 54 is smaller than the width of a cross section 54d including the portion of the silicide layer 54 in contact with the channel film 49. In the cross section of the first columnar body 40A including the cross section 54d, the silicide layer 54, the tunnel film 43, the charge storage film 42, and the barrier film 41 are arranged in the order from the inside.

A length of the silicide layer 54 at the first connecting end 91 in the X direction and the Y direction is longer than a length between the first channel end 93a and the second channel end 93b at the second connecting end 92 in the X direction and the Y direction. Further, the length of the silicide layer 54 at the first connecting end 91 in the X direction and the Y direction is longer than the cap layer 51 by approximately the same as the length of the channel film 44.

A method of manufacturing the memory cell array according to the second embodiment includes a silicide layer forming process, instead of the metal layer forming process of the method of manufacturing the memory cell array 10 according to the first embodiment. That is, the method for manufacturing the memory cell array according to the second embodiment includes, for example, the pre-process, the first stacking process, the first hole forming process, the second stacking process, the opening forming process, the channel film forming process, the slimming process, the core forming process, the substituting process, the slit processing process, the cap layer forming process, and the silicide layer forming process. In the following, the silicide layer forming process will be described.

Figure 16:
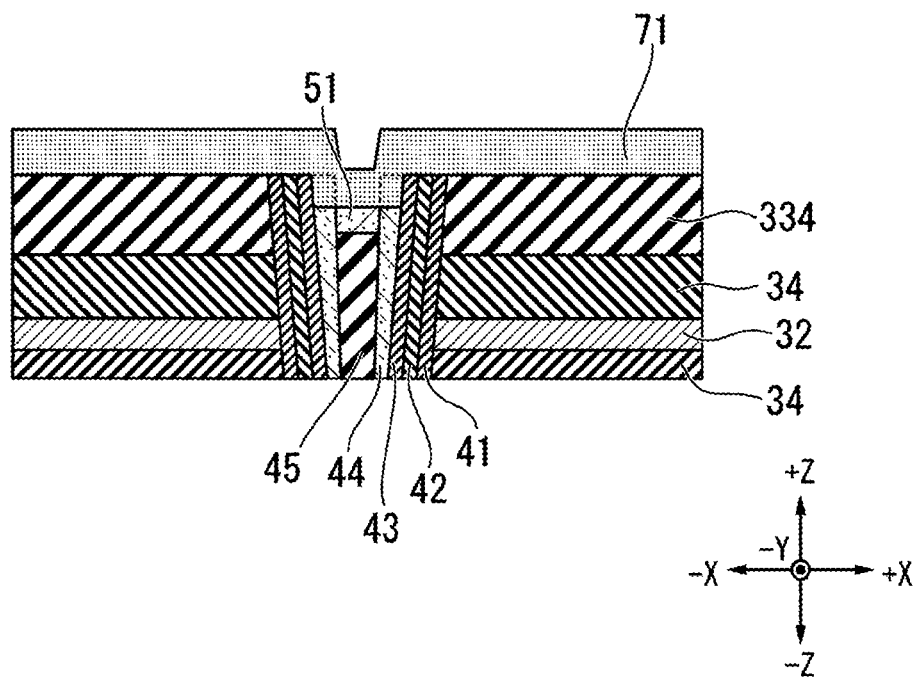
FIG. 16 is an enlarged cross-sectional view illustrating an upper end of the first columnar body in a manufacturing process of the memory cell array according to the second embodiment.
Figure 17:
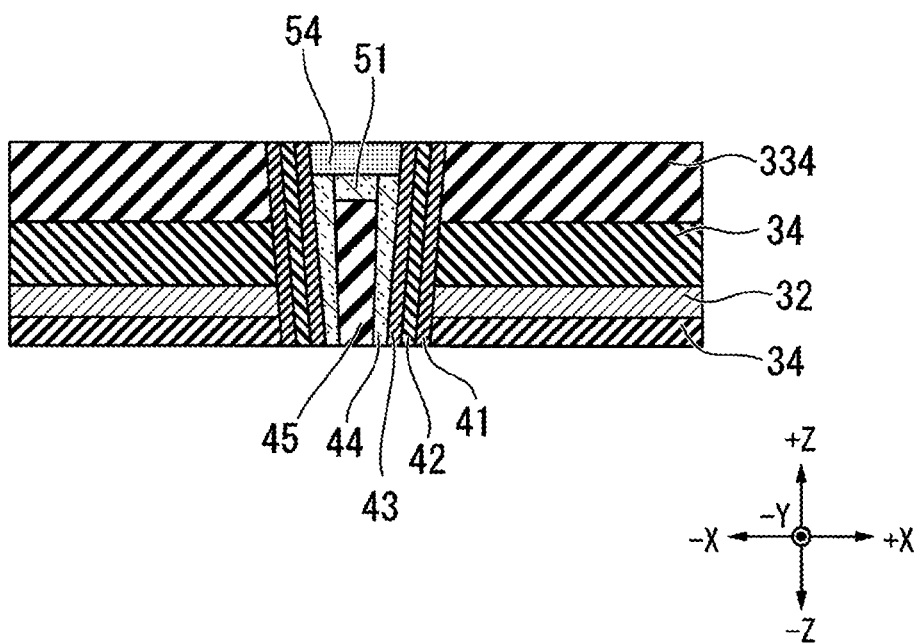
FIG. 17 is an enlarged cross-sectional view illustrating an upper end of the first columnar body in a manufacturing process of the memory cell array according to the second embodiment.

FIGS. 16 and 17 are cross-sectional views illustrating the silicide layer forming process. In the silicide layer forming process, a transition metal layer 71 is formed on the upper surface of the insulating layer 334 and the upper surface of the cap layer 51 with a constant thickness. The transition metal layer 71 is made of, for example, titanium, molybdenum, or the like. An upper surface of the transition metal layer 71 above the cap layer 51 is higher than the upper surface of the insulating layer 334.

Next, the transition metal layer 71 is silicidized by, for example, solid phase reaction. At this time, the upper portion of the channel film 44 which is formed by the channel film forming process is also silicidized. That is, the portion immediately above the channel film 44 in the silicide layer 54 in the Z direction illustrated in FIG. 15 is a layer formed by silicidation of the channel film 44 in the silicide layer forming process. In FIGS. 15 and 16, the length of the silicide layer 54 immediately above the channel film 44 in the Z direction and the length of the silicide layer 54 immediately above the core 45 are the same. However, the length of the silicide layer 54 immediately above the channel film 44 varies depending on the conditions when performing the silicidation of the above transition metal layer 71 or the material of the channel film 44. In the silicide layer forming process, the upper portion of the channel film 44 formed by the channel film forming process may be silicidized, and the lower end of the silicide layer 54 immediately above the channel film 44 in the Z direction may be positioned above the lower end of the silicide layer 54 immediately above the core 45.

Subsequently, as illustrated in FIG. 17, the upper portion of the silicidized transition metal layer 71 is removed until the insulating layer 334 is exposed. The silicidized transition metal layer 71 is removed by, for example, annealing and wet etching. The silicide layer 54 surrounded by the channel film 44 is formed above the cap layer 51.

According to the semiconductor storage device according to the second embodiment described above, the power consumption may be reduced by having the silicide layer 54. In the semiconductor storage device according to the second embodiment, the silicide layer 54 is interposed between the channel film 49 and the channel film 44. Therefore, the contact resistance between the channel film and the channel film 44 may be reduced. The power consumption of the semiconductor storage device 1 according to the second embodiment may be reduced by reducing the contact resistance in the memory cell array.

By arranging the cap layer 51, and the metal layer 52 or the silicide layer 54 between the core 50 and the core 45 in the Z direction, the contact resistance in the memory cell array may be reduced as compared with the configuration in the related art. By arranging the metal layer 52, the contact resistance may be further reduced as compared to the case where the silicide layer 54 is disposed. Meanwhile, it is difficult to peel off the silicide layer 54 from the cap layer 51 or the core 50 as compared with the metal layer 52. Therefore, by arranging the silicide layer 54, the cell current may be stabilized as compared to the case where the metal layer 52 is disposed. However, the contact resistance or the conductivity of the cell current varies depending on the material and size of each component of the memory cell array. Selection whether the metal layer 52 or the silicide layer 54 is disposed between the core 50 and the core 45 in the Z direction may be made based on the material, the size, or the like of each component of the memory cell array.

According to the semiconductor storage device according to the second embodiment, the width of the lower end 49x is smaller than the width of the cross section 54d, and thus, the lower end 49x, that is the entire bottom surface of the channel film 49 may be brought into contact with the cross section 54d to reduce the power consumption. It is possible to prevent the occurrence of the interruption of the cell current by the stable connection between the lower end 49x and the cross section 54d.

In the semiconductor storage device according to the second embodiment, the tunnel films 43 and 48 and the charge storage films 42 and 47 are interposed between the channel films 44 and 49 and the barrier films 41 and 46. According to the semiconductor storage device according to the second embodiment, when the cell current is supplied to the channel film 49, charges may be stored in the charge storage films 42 and 47 by the tunnel effect.

(Supplementary Note) In the following, supplementary notes will be made on some semiconductor storage devices.

[1] A semiconductor storage device including:
a stacked body in which a plurality of conductive layers and a plurality of insulating layers are alternately stacked in a first direction;
a first columnar body provided in the stacked body; and
a second columnar body provided in the stacked body and aligned with the first columnar body in the first direction,
in which the second columnar body includes a channel film,
the first columnar body includes a channel film, a core provided closer to a center of the first columnar body than the channel film of the first columnar body in a second direction, and a conductive layer being in contact with the channel film of the second columnar body between the channel film of the second columnar body and the core in the first direction, and
the conductive layer includes at least one of a metal layer and a silicide layer.

[2] The semiconductor storage device described in [1], in which the conductive layer includes the metal layer, is provided closer to the center of the first columnar body than the channel film of the first columnar body in the second direction, is provided on an end of the first columnar body in contact with the second columnar body, is positioned between the core and the second columnar body in the first direction, and is in contact with the channel film of the first columnar body.

[3] The semiconductor storage device described in [1], in which the conductive layer includes the silicide layer, is provided on an end of the first columnar body in contact with the second columnar body, is positioned between the core and the second columnar body in the first direction, and is in contact with the channel film of the first columnar body.

[4] The semiconductor storage device described in [1], in which the first columnar body includes a first connecting end in contact with the second columnar body,
the second columnar body includes a second connecting end in contact with the first columnar body,
the channel film of the second columnar body includes a first channel end which is one end of the second direction, and a second channel end which is the other end of the second direction, and
a length of the conductive layer at the first connecting end in the second direction is longer than a length between the first channel end and the second channel end at the second connecting end in the second direction.

[5] The semiconductor storage device described in [1], in which the first columnar body includes a charge storage film provided on a side opposite to the core with respect to the channel film of the first columnar body.

[6] The semiconductor storage device described in [1], in which a cap layer made of a semiconductor is provided between the core of the first columnar body and the conductive layer.

[7] The semiconductor storage device described in [6], in which the thickness of the cap layer in the first direction is larger than the thickness of the conductive layer in the first direction.

[8] The semiconductor storage device described in [1], in which the conductive layer includes a first surface in contact with the second columnar body, and the first surface includes a recess that is recessed toward the core, and
the channel film of the second columnar body includes a portion positioned in the recess.

[9] The semiconductor storage device described in [1], in which the second columnar body includes a core provided closer to a center of the second columnar body than the channel film of the second columnar body in the second direction, an insulating layer provided on a side opposite to the core of the second columnar body with respect to the channel of the second columnar body in the second direction, and a part of the conductive layer is in contact with the insulating layer in the first direction.

[10] The semiconductor storage device described in [1], in which the first columnar body includes a charge storage film provided on a side opposite to the core of the first columnar body with respect to the channel film of the first columnar body.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, instead of being used as the memory cell transistor MT, a portion where the conductive layer 32 and the columnar body 40 intersect may be used as a dummy transistor which is not used for storing charges.

What is claimed is:

1. A semiconductor storage device comprising:
    a stacked body including a plurality of conductive lines and a plurality of insulating layers alternately stacked along a first direction;
    a first columnar body extending through the stacked body; and
    a second columnar body, extending through the stacked body, that is aligned with the first columnar body along the first direction,
    wherein the second columnar body includes a second channel film,
    wherein the first columnar body includes a core, a first channel film surrounding the core, and a conductive layer, and
    wherein the conductive layer is in contact with the second channel film of the second columnar body and the first channel film of the first columnar body the conductive layer includes at least one of a metal layer and a silicide layer.

2. The semiconductor storage device according to claim 1, wherein the conductive layer includes the metal layer, wherein the conductive layer is surrounded by the first channel film, and provided on an end of the first columnar body in contact with the second columnar body.

3. The semiconductor storage device according to claim 1, wherein the conductive layer includes the silicide layer, wherein the conductive layer is surrounded by the first channel film, and provided on an end of the first columnar body to be in contact with the second columnar body.

4. The semiconductor storage device according to claim 1, wherein the first columnar body includes a first connecting end in contact with the second columnar body,
    the second columnar body includes a second connecting end in contact with the first columnar body,
    the second channel film of the second columnar body, along a second direction perpendicular the first direction, includes a first channel end and a second channel end,
    a first length of the conductive layer at the first connecting end along the second direction is greater than a second length at the second channel end, which is in contact with the conductive layer, along the second direction.

5. The semiconductor storage device according to claim 1, wherein the first columnar body includes a charge storage film provided along a side surface opposite the first channel film of the first columnar body from the core.

6. The semiconductor storage device according to claim 1, wherein the second channel film extends into an upper portion of the conductive layer along the first direction.

7. A method comprising:
    providing a first stacked body including a plurality of first substitution layers and a plurality of first insulating layers alternately stacked along a first direction;
    forming a first hole extending through the first stacked body;
    forming, in the first hole, a first columnar body including a first core surrounded by a first channel film;
    replacing the plurality of first substitution layers with a plurality of first conductive lines;
    removing an upper portion of the first core to form a second hole;
    forming a conductive layer in the second hole;
    providing a second stacked body including one or more second substitution layers and one or more second insulating layers alternately stacked along the first direction;
    forming a third hole extending through the second stacked body;
    forming, in the third hole, a second columnar body including a second core surrounded by a second channel film; and
    replacing the one or more second substitution layers with one or more second conductive lines,
    wherein the conductive layer is in contact with the second channel film of the second columnar body and the first channel film of the first columnar body.

8. The method according to claim 7, wherein the first columnar body includes a first charge storage film provided along a side surface opposite the first channel film of the first columnar body from the first core, and the second columnar body includes a first charge storage film provided along a side surface opposite the second channel film of the second columnar body from the second core.

9. The method according to claim 7, wherein the second channel film extends into an upper portion of the metal or silicide layer along the first direction.

* * * * *